United States Patent
Grodzki et al.

(10) Patent No.: US 9,618,598 B2
(45) Date of Patent: Apr. 11, 2017

(54) MAGNETIC RESONANCE METHOD, APPARATUS AND RADIOFREQUENCY COIL FOR ACQUIRING MAGNETIC RESONANCE DATA OF AT LEAST ONE TOOTH

(71) Applicants: David Grodzki, Erlangen (DE); Lars Lauer, Neunkirchen (DE)

(72) Inventors: David Grodzki, Erlangen (DE); Lars Lauer, Neunkirchen (DE)

(73) Assignee: Siemens Aktiengesellschaft, Munich (DE)

( * ) Notice: Subject to any disclaimer, the term of this patent is extended or adjusted under 35 U.S.C. 154(b) by 772 days.

(21) Appl. No.: 14/037,632

(22) Filed: Sep. 26, 2013

(65) Prior Publication Data

US 2014/0084923 A1 Mar. 27, 2014

(30) Foreign Application Priority Data

Sep. 26, 2012 (DE) ........................ 10 2012 217 483

(51) Int. Cl.
G01R 33/48 (2006.01)
G01R 33/3415 (2006.01)
G01R 33/561 (2006.01)
G01R 33/341 (2006.01)

(52) U.S. Cl.
CPC ......... *G01R 33/561* (2013.01); *G01R 33/341* (2013.01); *G01R 33/4816* (2013.01); *G01R 33/4824* (2013.01); *G01R 33/3415* (2013.01)

(58) Field of Classification Search
CPC G01R 33/341; G01R 33/561; G01R 33/4816; G01R 33/4824; G01R 33/3415
See application file for complete search history.

(56) References Cited

U.S. PATENT DOCUMENTS

| | | | |
|---|---|---|---|
| 2011/0187368 A1* | 8/2011 | Grodzki | G01R 33/4816 324/309 |
| 2012/0074938 A1 | 3/2012 | Grodzki et al. | |
| 2012/0223711 A1* | 9/2012 | Weinberg | G01R 33/3852 324/309 |

FOREIGN PATENT DOCUMENTS

| | | |
|---|---|---|
| DE | 10 2009 026 897 | 12/2010 |
| JP | 11-76197 | 3/1999 |

OTHER PUBLICATIONS

Nielles-Vallespin et al., "3D Radial Projection Technique with Ultrashort Echo Times for Sodium MRI: Clinical Applications in Human Brain and Skeletal Muscle," Magnetic Resonance in Medicine, vol. 57, pp. 74-81, (2007).

(Continued)

*Primary Examiner* — Gregory H Curran
(74) *Attorney, Agent, or Firm* — Schiff Hardin LLP

(57) ABSTRACT

In a magnetic resonance method and apparatus for the acquisition of measurement data of at least one tooth of an examination subject, a pulse sequence is employed that has an echo time TE of less than 0.5 milliseconds, and spatial coding of the acquired measurement data takes place in only two spatial directions. Projection image data are reconstructed from the acquired measurement data. A coil for a magnetic resonance tomography system, which coil is dedicated to dental imaging, has at least one coil element, and each coil element of the coil has an individual acquisition volume that encompasses at least one tooth.

11 Claims, 4 Drawing Sheets

(56) References Cited

OTHER PUBLICATIONS

Weiger et al. "MRI with Zero Echo Time: Hard versus Sweep Pulse Excitation," Magnetic Resonance in Medicine 66, pp. 379-389, (2011).
Grodzki et al. "Ultra short Echo Time Imaging using Pointwise Encoding Time reduction with Radial Acquisition (PETRA)", Proc. Intl. Soc. Mag. Reson. Med., vol. 19, p. 2815, (2011).
Bracher et al., "Feasibility of Ultra-Short Echo Time (UTE) Magnetic Resonance Imaging for Identification of Carious Lesions", Magnetic Resonance in Medicine 000:000-000 , pp. 1-8, (2011).
Messiou et al. "Quantifying sclerotic bone metastases with 2D ultra short TE MRI: A feasibility study", Cancer Biomarkers; vol. 7; pp. 211-218 (2010).
Grodzki et al. "Ultrashort Echo Time Imaging Using Pointwise Encoding Time Reduction With Radial Acquisition (PETRA)," Magnetic Resonance in Medicine, vol. 67, pp. 510-518, (2012).
Grodzki C. M.; "Entwicklung von neuen Sequenzen mit ultrakurzen Echozeiten für die klinische Magnetresonanzbildgebung"; Bayerische Julius-Maximilians-Universität Würzburg—Dissertation, pp. 1-110; (2011).

\* cited by examiner

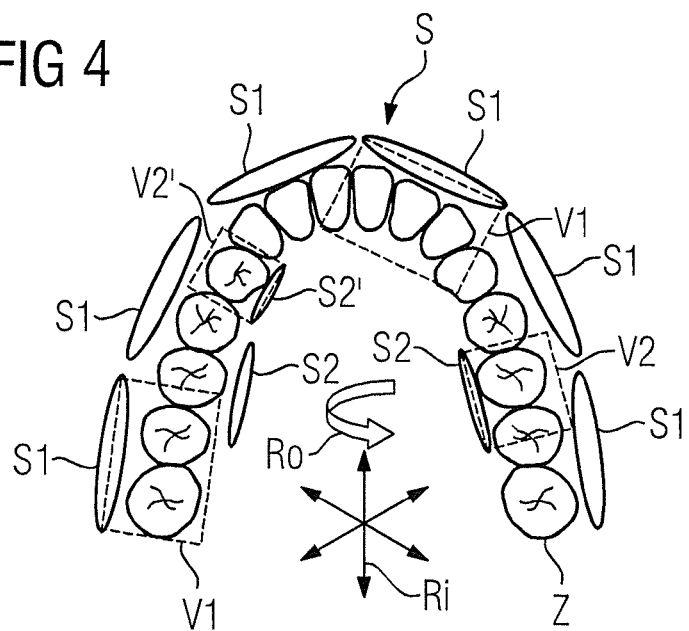
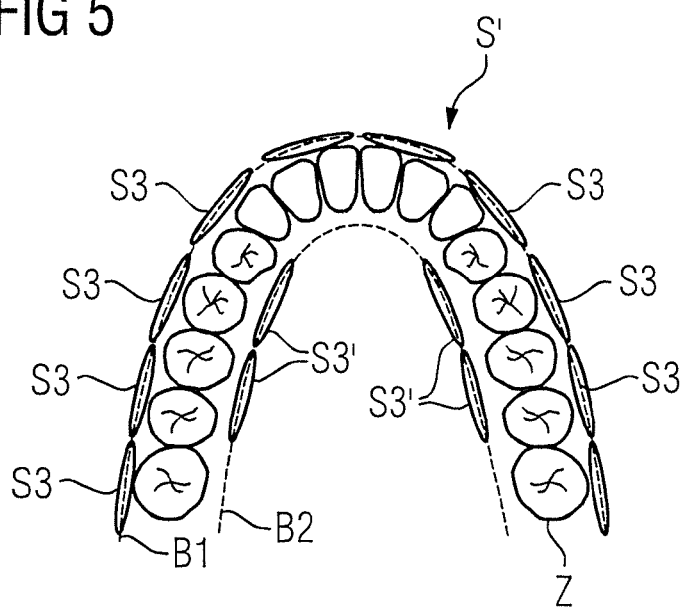

MAGNETIC RESONANCE METHOD, APPARATUS AND RADIOFREQUENCY COIL FOR ACQUIRING MAGNETIC RESONANCE DATA OF AT LEAST ONE TOOTH

BACKGROUND OF THE INVENTION

The present invention concerns: a method to acquire measurement data of at least one tooth of an examination subject by means of magnetic resonance technology, as well as a magnetic resonance system and an electronically readable data medium for implementing such a method.

FIELD OF THE INVENTION

Magnetic resonance (MR) is a known modality with which images of the inside of an examination subject can be generated. Expressed in simplified form, the examination subject is positioned in a strong, static, homogeneous basic magnetic field (also called a $B_0$ field) with a field strength from 0.2 Tesla to 7 Tesla or more in a magnetic resonance data acquisition unit (scanner), such that the nuclear spins of the examination subject orient along the basic magnetic field. To trigger nuclear magnetic resonance signals, radio-frequency excitation pulses (RF pulses) are radiated into the examination subject, and the triggered nuclear magnetic resonance signals are measured (detected) and are entered into an electronic memory in an organized arrangement known as k-space. From the k-space data, MR images are reconstructed or spectroscopy data are determined. For spatial coding of the measurement data, rapidly switched (activated) magnetic gradient fields are superimposed on the basic magnetic field. The acquired measurement data are digitized and stored as complex numerical values in k-space, such as in a matrix. An associated MR image can be reconstructed from the k-space matrix populated with values, for example by means of a multidimensional Fourier transformation.

Sequences with very short echo times TE—i.e. with TE less than 0.5 milliseconds—offer new fields of application for magnetic resonance tomography (MRT). They enable the visualization of substances that cannot be depicted with conventional sequences such as (turbo) spin echo ((T)SE) or gradient echo (GRE) since their T2 constant—i.e. the decay constant of the transversal magnetization—is markedly shorter than the echo time of the previously typical sequences. However, if the echo times of a sequence lie within the range of these decay times, it is possible to depict the signals of these substances in MR images. Examples of substances with T2 decay times which could not be shown with previously typical sequences are, for instance, bones, ligaments, tendons and ice. These substances have T2 values between 30 and 200 microseconds. The components of teeth—for example dentin—also have a very short T2 of less than 200 microseconds.

Sequences with such short echo times (sequences with ultrashort echo time, abbreviated as: UEZ sequences) are also known. Examples are: UTE ("Ultrashort Echo Time"), for example as described in the article by Sonia Nielles-Vallespin, "3D radial projection technique with ultrashort echo times for sodium MRI: Clinical applications in human brain and skeletal muscle", Magn. Res. Med. 2007, 57, Pages 74-81; PETRA ("Pointwise Encoding Time reduction with Radial Acquisition") as described by Grodzki et al. in "Ultra short Echo Time Imaging using Pointwise Encoding Time reduction with Radial Acquisition (PETRA)", Proc. Intl. Soc. Mag. Reson. Med. 19 (2011), Page 2815; or z-TE as described by Weiger et al. in "MRI with zero echo time: hard versus sweep pulse excitation", Magn. Reson. Med. 66 (2011), Pages 379-389.

In PETRA or z-TE sequences, the gradients are already activated during the excitation. Excitation pulses in PETRA or z-TE therefore must be slice-selective. Therefore, a slice-selective two-dimensional (2D) measurement is not possible with these sequences. In UTE sequences, the imaging gradients are activated simultaneously with the data acquisition after an excitation pulse. There a slice-selective 2D measurement (and therefore a 2D imaging) is possible.

In contrast to this, PETRA and z-TE have shorter coding times than UTE. Therefore, given the same acquisition bandwidth, a higher resolution and a better SNR can be achieved with PETRA or z-TE than with UTE. 2D measurements are multiple times faster than 3D measurements, inherently due to the smaller data set. However, the use of UTE sequences is technically not without problems, both in 2D and in 3D measurements. The reasons for this are, for example, that eddy currents during the ramp-up of the gradients interfere with the measurement.

In Bracher et al. "Feasibility of UTE MRI for Identification of Carious Lesions", MRM, 2011, it is described how a UTE sequence can be used for dental imaging, i.e. to depict teeth. As described in that article, caries can be detected with the UTE sequence that is used. In dental imaging, in principle a better contrast can also be generated with MR than (for example) computer tomography or x-rays. However, the UTE sequence is subject to the aforementioned interferences due to eddy currents, which leads to limitations in the image quality. As has likewise been noted above, given UTE the acquisition times are downwardly limited by the necessary coding times, resulting in the acquisition times in UTE dental imaging often being uncomfortably long for a patient.

SUMMARY OF THE INVENTION

Another object of the present invention is to provide a method to acquire measurement data of at least one tooth of an examination subject by means of magnetic resonance technology, as well as to provide a coil that is dedicated to dental imaging, and a magnetic resonance system and an electronically readable data medium that enable effective imaging of teeth.

In a method according to the invention for the acquisition of measurement data of at least one tooth of an examination subject using magnetic resonance technology, a pulse sequence is employed that has an echo time TE of less than 0.5 milliseconds, and spatial coding of the acquired measurement data takes place in only two spatial directions, and projection image data are reconstructed from the acquired measurement data.

For the imaging of teeth, which occupy only a small volume, it is normally sufficient to create projection image data in order to enable an assessment of the imaged tooth. A sufficiently high-contrast imaging of teeth is possible using UEZ sequences. When these UEZ sequences are used to acquire projection data, high-contrast and high-resolution projection images of teeth can be created quickly and stably.

A coil for a magnetic resonance tomography system, which coil is dedicated to dental imaging according to the invention, has at least one coil element, and each coil element of the coil has an individual acquisition volume that encompasses at least one tooth.

A reduction of the applied SAR (specific absorption rate) value and an increase of the SNR (signal-to-noise ratio) of the acquired measurement data are additionally possible with a coil dedicated to dental imaging that can be arranged in immediate proximity to the tooth to be examined.

A magnetic resonance system according to the invention for the acquisition of measurement data in an imaging region within an examination subject, and the creation of projection image data, has a basic field magnet, a gradient field system, at least one RF antenna, and a control device to operate the gradient field system and the at least one RF antenna, to receive the measurement data acquired by the at least one RF antenna, and to evaluate the measurement data and create image data sets. The RF antenna includes at least one coil dedicated to dental imaging. The magnetic resonance system is designed to acquire measurement data of at least one tooth of the examination subject by the control device operating the gradient field system and the RF antenna according to a pulse sequence that has an echo time TE of less than 0.5 milliseconds, and with a spatial coding of the acquired measurement data taking place in only two spatial directions. Furthermore, the control device embodies or communicates with a processor configured to reconstruct projection image data from the acquired measurement data. In particular, the magnetic resonance system is designed to implement a method according to the invention as described herein.

An electronically readable data storage medium according to the invention is encoded with or stores electronically readable control information that causes the method according to the invention as described herein to be executed when the data medium is loaded in a control device of a magnetic resonance system.

The advantages and embodiments described with regard to the method analogously apply to the magnetic resonance system and the electronically readable data medium.

BRIEF DESCRIPTION OF THE DRAWINGS

FIG. 4 schematically shows an example of a coil dedicated to dental imaging.

FIG. 5 schematically shows an additional example of a coil dedicated to dental imaging.

DESCRIPTION OF THE PREFERRED EMBODIMENTS

Figure 1:
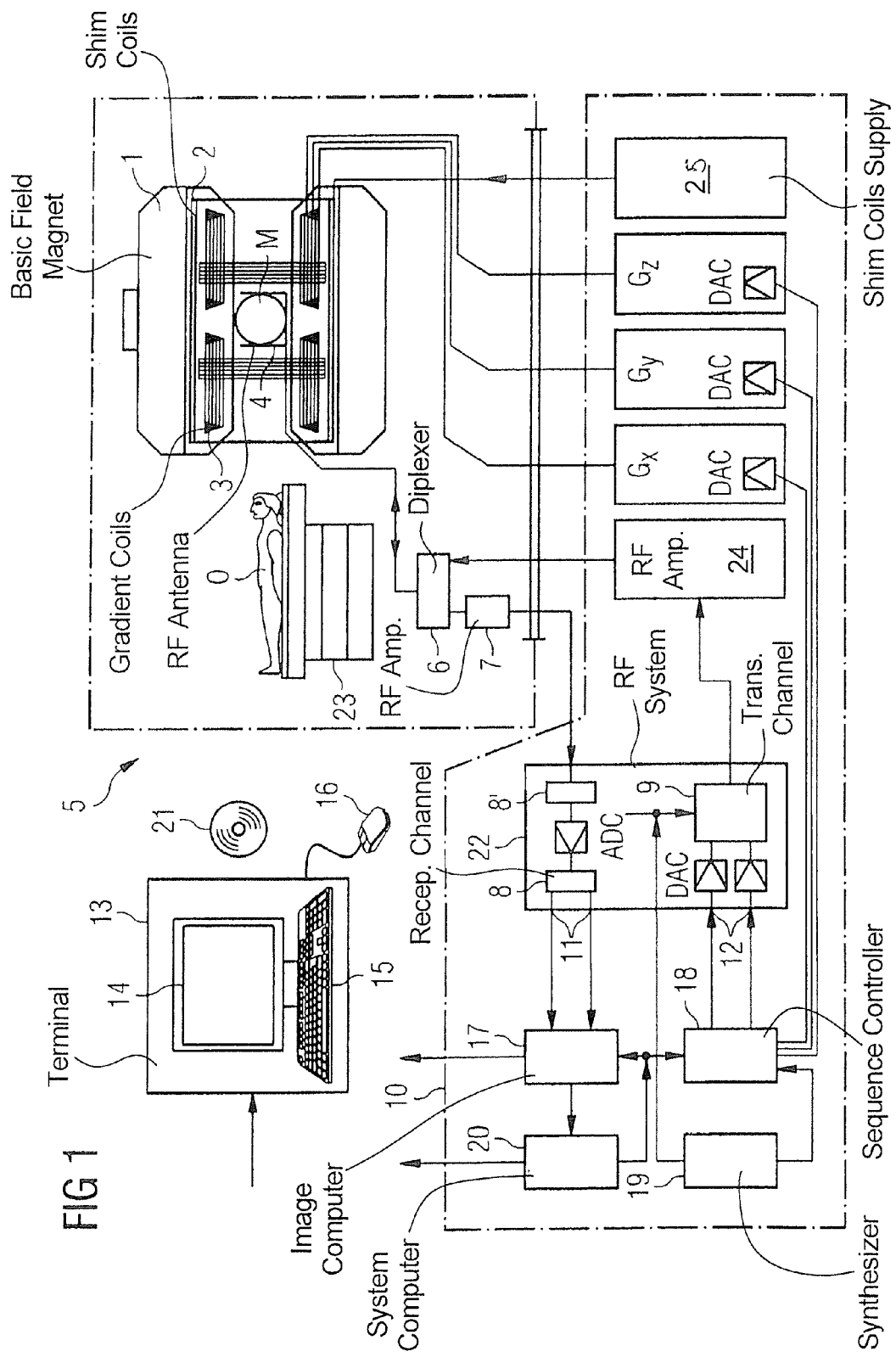
FIG. 1 schematically illustrates a magnetic resonance system according to the invention.

FIG. 1 is a schematic representation of a magnetic resonance system 5 (a magnetic resonance imaging or magnetic resonance tomography apparatus). A basic field magnet 1 generates a temporally constant, strong magnetic field for polarization or alignment of the nuclear spins in an imaging region O of an examination subject U (for example a part of a human body that is to be examined, in particular the teeth), who is examined while lying on a table 23 in the magnetic resonance system 5. The high homogeneity of the basic magnetic field that is required for the magnetic resonance measurement (data acquisition) is defined in a typically (but not necessarily) spherical measurement volume M in which are arranged the parts of the human body that are to be examined. To support the homogeneity requirements, and in particular to eliminate temporally invariable influences, shim plates made of ferromagnetic material are mounted at a suitable location. Temporally variable influences are eliminated by shim coils 2 supplied from a shim coils supply 25.

In the basic field magnet 1, a cylindrical gradient coil system 3 is used which has three sub-windings. Each sub-winding is supplied by an amplifier with current to generate a (for example) linear (also temporally variable) gradient field in the respective direction of the Cartesian coordinate system. The first sub-winding of the gradient field system 3 generates a gradient $G_x$ in the x-direction, the second sub-winding generates a gradient $G_y$ in the y-direction, and the third sub-winding generates a gradient $G_z$ in the z-direction. Each amplifier includes a digital/analog converter that is controlled by a sequence controller 18 for accurately timed generation of gradient pulses.

Located within the gradient field system 3 are one (or more) radio-frequency antennas 4—in particular at least one multichannel RF transmission coil and at least one RF reception coil—which converts the radio-frequency pulses emitted by a radio-frequency power amplifier 24 into an alternating magnetic field for excitation of the nuclei and alignment of the nuclear spins of the examination subject U to be examined or of the imaging region O of the examination subject U that is to be examined. Each radio-frequency antenna 4 comprises one or more RF transmission coils and one or more RF reception coils in the form of an annular (advantageously linear or matrix-like arrangement) of component coils, and has a reception mode and a transmission mode. Here the magnetic resonance system 5 has, as part of the radio-frequency antenna 4, a coil S (only shown in FIGS. 4 and 5) dedicated to dental imaging. The alternating field emanating from the precessing nuclear spins—i.e. normally the spin echo signals caused by a pulse sequence made up of one or more radio-frequency pulses and one or more gradient pulses—is also converted by the RF reception coils of the radio-frequency antenna 4 into a voltage (measurement signal) that is supplied via an amplifier 7 to a radio-frequency reception channel 8 of a radio-frequency system 22. The radio-frequency system 22 furthermore has a transmission channel 9 in which the radio-frequency pulses are generated for the excitation of the nuclear magnetic resonance. The respective radio-frequency pulses are digitally represented in the sequence controller 18 as a series of complex numbers based on a pulse sequence predetermined by the system computer 20. This number sequence is supplied as a real part and imaginary part to a digital/analog converter in the radio-frequency system 22 via respective inputs 12, and from the digital/analog converter to a transmission channel 9. In the transmission channel 9, the pulse sequences are modulated on a radio-frequency carrier signal whose base frequency corresponds to the center frequency.

The switching from transmission operation to reception operation takes place via a transmission/reception diplexer 6 which requires a minimum switching time $T_{min}$ to switch from transmission mode to reception mode. The RF transmission coils of the radio-frequency antenna(s) 4 radiate(s) the radio-frequency pulses for excitation of the nuclear spins into the measurement volume M, and resulting echo signals are scanned via the RF reception coil(s). The correspondingly acquired magnetic resonance signals are phase-sensitively demodulated to an intermediate frequency in a reception channel 8' (first demodulator) of the reception channel of the radio-frequency system 22 and digitized in an analog/digital converter (ADC). This signal is further demodulated to a frequency of 0. The demodulation to a frequency of 0 and the separation into real part and imaginary part occur in a second demodulator 8 after the digitization in the digital domain. An MR image or three-dimensional image data set can be reconstructed by an image computer 17 from the measurement data acquired in such a manner. The administration of the measurement data, the image data and the control programs takes place via the system computer 20. Based on a specification with control programs, the sequence controller 18 monitors the generation of the respective desired pulse sequences and the corresponding scanning of k-space. The sequence controller 18 controls the accurately-timed switching of the gradients, the emission of the radio-frequency pulses with defined phase amplitude and the reception of the magnetic resonance signals.

The time base for the radio-frequency system 22 and the sequence controller 18 is provided by a synthesizer 19. The selection of corresponding control programs to generate an acquisition of measurement data (which control programs are stored on a DVD 21, for example), the selection of a selected region O that should be excited and from which measurement data should be acquired, the specification of a substance with which the selected region O is filled to determine the flip angle for the desired signal curve, and the presentation of a generated MR image take place via—for example—a terminal 13 that has a keyboard 15, a mouse 16 and a monitor 14.

Figure 2:
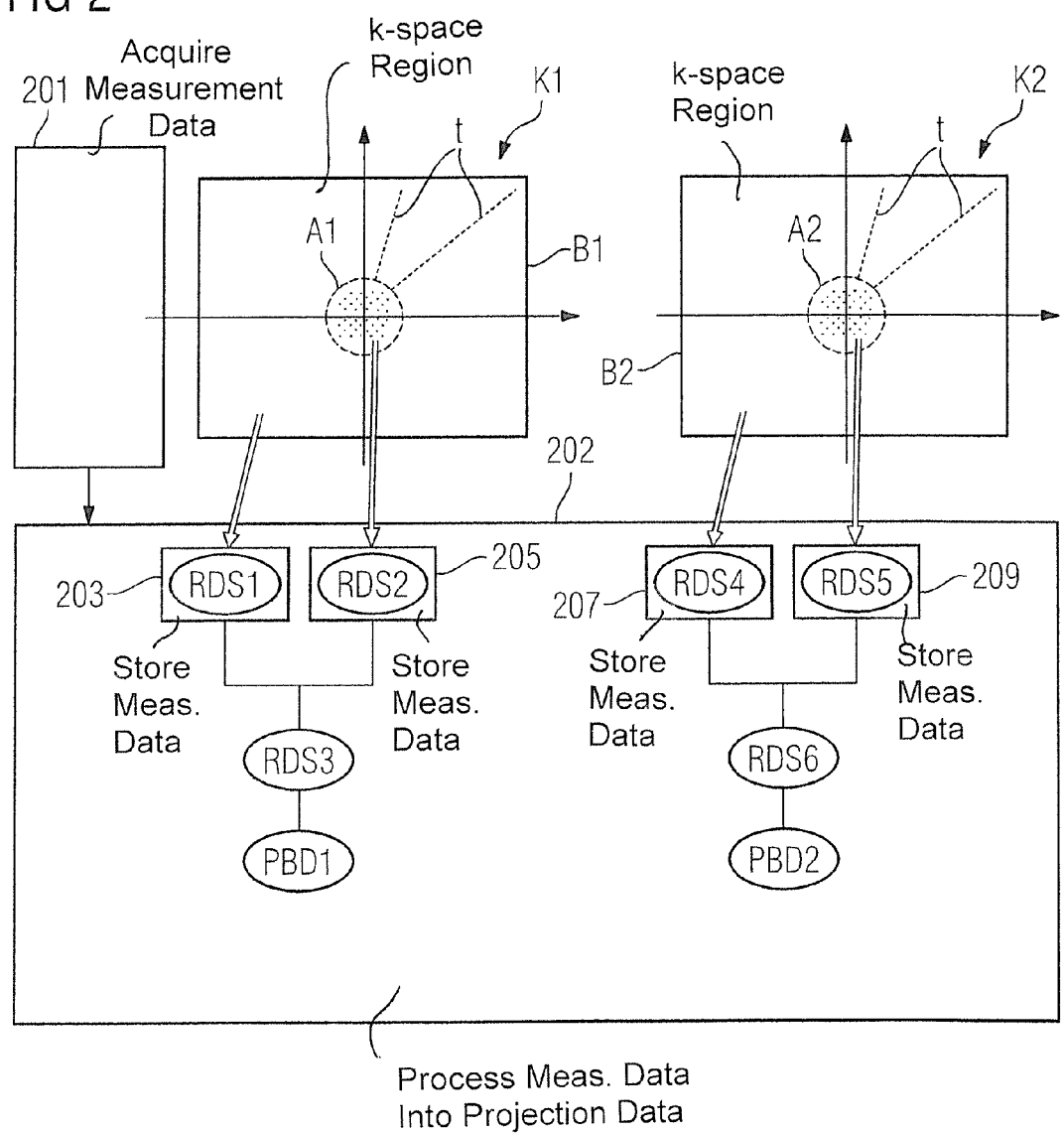
FIG. 2 is a flowchart of an embodiment of the method according to the invention.

FIG. 2 shows a flowchart and embodiment of the method according to the invention for the acquisition of measurement data of at least one tooth of an examination subject by magnetic resonance, by operating an MR data acquisition unit, according to a pulse sequence with an echo time TE of less than 0.5 milliseconds, for example a UEZ sequence (in particular a PETRA sequence), and by spatially coding the acquired measurement data in only two spatial directions. From the acquired measurement data, projection image data are reconstructed in a processor.

Measurement data are generated and acquired in an imaging area of an examination subject by the magnetic resonance data acquisition unit by radiating RF pulses into the imaging area and activating gradients (Block 201).

This occurs such that k-space K1=B1+A1 (schematically shown to the upper right in FIG. 2)—corresponding to the imaging area—is scanned such that a first region B1 of k-space K1 to be scanned is scanned along radial trajectories t. For clarity, only two trajectories t as examples are schematically shown as dotted lines t. The measurement data are additionally generated and acquired such that a second region A1 that corresponds to k-space K to be scanned that is not covered by the first region B1 (A1=K1−B1) and includes the k-space center is scanned at least twice, point by point, corresponding to a single point imaging sequence. This is represented within the region A1 by the schematic points. The arrangement of points in the region A1 in FIG. 2 is selected arbitrarily and can depend on the single point imaging sequence that is used. In particular, a Cartesian sampling can take place in region A1. For example, a RASP sequence can be used for this purpose.

For the radial scanning of the first region B1, a sequence corresponding to a radial portion of a PETRA sequence can be used, which is why in total only one PETRA sequence needs to be used, because with such a sequence, a region that includes the k-space center is also scanned by a single point imaging sequence such as RASP.

The echo times (TE) that are used can be selected differently in the sequences that are used for the first region B and the second region A, for example depending on the desired contrasts, wherein the fact that the k-space center significantly determines the contrast impression is utilized, or depending on technical requirements that are provided by the measurement system, for example.

The measurement data acquired in this way are processed into projection image data PDS (Block 202).

For example, for this the measurement data acquired from the first region B1 are stored in a first raw data set RDS1 (Block 203), and the measurement data acquired from the second region A1 are stored in a second raw data set RDS2 (Block 205). The two raw data sets RDS1 and RDS2 can now be combined into a raw data set RDS3 (possibly using a regridding method) from which the projection image data PBD1 are reconstructed.

If multiple channels for control and for the reception of measurement data via different coil elements can be present simultaneously in the same measurement for readout of k-space K1 (which, for example, corresponds to a first tooth to be imaged), an additional k-space K2 (which, for example, corresponds to a second tooth to be imaged) can be read out in the same way by means of another coil element. K-space K2 is composed (analogous to K1) of a first region B2 and a second region A2 and is likewise read out in the manner already described above with reference to K1.

For example, the measurement data acquired from the first region B2 are thereby stored in a first raw data set RDS4 (Block 207), and the measurement data acquired from the second region A2 are stored in a second raw data set RDS5 (Block 209). The two raw data sets RDS4 and RDS5 can now be combined into a raw data set RDS6 (possibly using a regridding method) from which the projection image data PBD2 are reconstructed.

The projection image data PBD1 and PBD2 can be stored and/or displayed for further use.

If additional channels of the magnetic resonance system and additional associated coil elements can be present in the same measurement, additional projection image data of additional teeth can also be acquired. The measurement is further accelerated overall via such a separate reconstruction of individual channels.

The first region B1, B2 of k-space K to be scanned is limited towards the k-space center. This is clarified by the circle (shown in a dashed line) around the k-space center. How far the first region B can extend towards the k-space center depends on the minimum switching time ($T_{min}$) between a transmission mode and a reception mode of the RF antenna that is used for radiation of RF pulses and acquisition of measurement data. The same correlations apply as they have been described in the already cited article by Grodzki et al.

In particular, the radio-frequency pulses of the pulse sequence that is used are hereby radiated into the examination subject by means of a coil dedicated to dental imaging, with an exposure volume of only a few cubic centimeters. In particular, the introduced SAR (specific absorption rate) values can therefore be reduced.

Furthermore, the echo signals generated with the pulse sequence that is used can be received from the examination subject by means of a dedicated coil with an acquisition volume of only a few cubic centimeters. A particularly low-noise acquisition is therefore possible.

Examples of such dedicated coils are provided in FIGS. 4 and 5.

Figure 3:
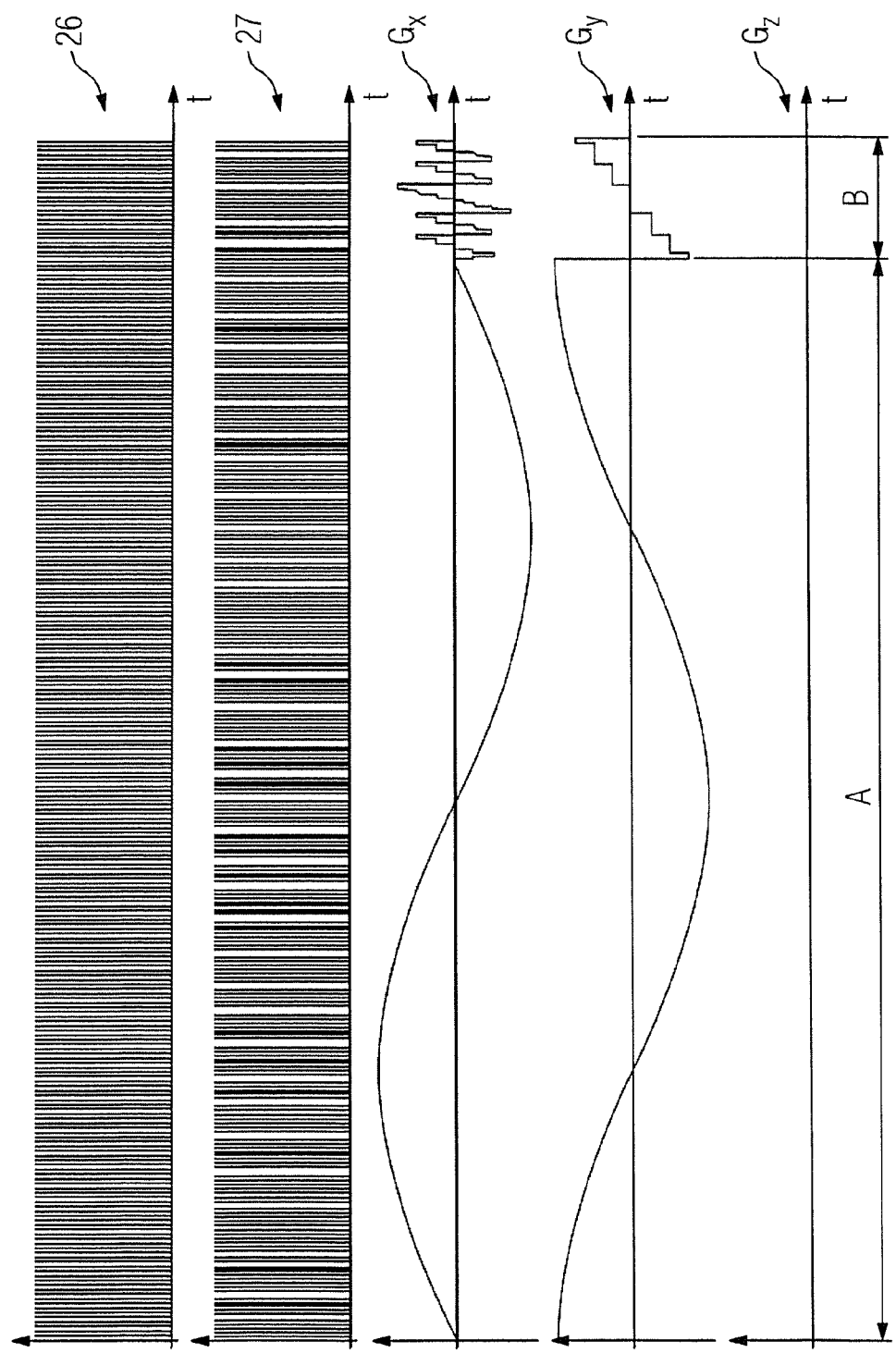
FIG. 3 schematically illustrates a PETRA sequence for the acquisition of measurement data.

A PETRA sequence for the acquisition of measurement data is schematically shown in FIG. 3. A PETRA sequence scheme is selected for the acquisition of projection data, for example as it can be used in connection with the present invention.

The first line in FIG. 3 shows the radiated RF excitation pulses 26; the second line shows the associated readout time periods 27.

Here only two phase coding gradients are switched. A coding in the third direction—the slice direction, here the z-direction—is foregone ($G_z=0$).

The phase coding gradients in the x-direction and y-direction are the same ($G_x=\sin(\phi)$ and $G_y=\cos(\phi)$), wherein $\phi$ is increased—beginning at $\phi=0$—by the angle 360°/(number of projections $N_{Proj}$) at every radial k-space trajectory until 360° are reached. Overall, $N_{Proj}$ radial projections (i.e. $N_{Proj}$ radial k-space trajectories) are thus acquired overall for the projection data set. This is shown in region "A" in FIG. 2, wherein there 250 radial k-space trajectories are read out which scan a first region of k-space to be scanned.

Shown in region "B" in FIG. 3 is the readout—by means of a single point imaging method—of Cartesian k-space points in a second region that corresponds to k-space to be scanned which is not covered by the first region and includes the k-space center.

PETRA sequences for projection imaging are particularly suitable for dental imaging since they operate more stably than (for example) 2D UTE sequences, and in exchange operate particularly quickly and with high resolution (the latter in particular in connection with coils dedicated to dental imaging).

FIG. 4 schematically shows an embodiment of a coil according to the invention for a magnetic resonance tomography system, which coil is dedicated to dental imaging. The coil S comprises at least one coil element S1, S2 or S2'. Each coil element coil element S1, S2 or S2' that is comprised by the coil S thereby has reception volume V1, V2 or V2' which covers at least one tooth, and from which the coil elements can receive measurement data. The coil S, S' can have coil elements S1, S2, S2', S3 which are designed as reception coil elements, or as transmission coil elements, or as transmission and reception coil elements. In particular, the coil S comprises such coil elements that it is suitable both for radiation of radio-frequency pulses and for reception of radio-frequency signals.

In the shown example, six coil elements S1 are shown that are arranged around the curve made by a schematically depicted row Z of teeth in a bite. The coil elements S1 therefore themselves follow a curve typically made by a row of teeth in a bite. Each of the coil elements S1 here exposes a volume which, for example, comprises at least two molars or up to four incisors.

Furthermore, in the schematic exemplary embodiment coil elements S2 and S2' are shown that are arranged within the schematically depicted row Z of teeth, and there likewise follow a curve typically made by a row of teeth. Such coil elements S2, S2' can be arranged "in gaps" with coil elements S1 arranged outside of the row of teeth. This means that they are arranged on the inside of the row of teeth, respectively opposite a gap between the outer coil elements S1.

A dedicated coil according to the invention comprises at least two coil elements, wherein the comprised coil elements can cover equally large reception volumes (but can also cover reception volumes of different sizes). For example, different or the same coil elements can be selected depending on their arrangement relative to a row of teeth to be examined. For example, this can occur depending on the coil element in the selected arrangement of opposite teeth of the row of teeth.

For example, here the coil elements S2 and S2' are shown smaller than the coil elements S1. They are therefore particularly suitable for an arrangement inside the oral cavity, between tongue and teeth. The reception volumes V2 of the coil elements S2 and the reception volumes V2' of the coil elements S2' (only one coil element S2' is shown in the Figure) are also accordingly smaller than the reception volumes V1 of the coil elements S1. However, the reception volume V1, V2, V2' of a coil element of a reception coil is in particular chosen to be at least so large that it can completely acquire data for an image of a tooth.

In one exemplary embodiment, the coil elements are mounted around the teeth in the manner of an easily insertable and easily removable dental retainer.

In the acquisition of the projection image data set it is possible to select the projection direction freely in three-dimensional space. This is illustrated using the direction cross Ri and the indicated rotation Ro in FIG. 4. The phase coding gradients ($G_x$, $G_y$, $G_z$) of the pulse sequence that is used are switched such that the projection direction of the projection image data proceeds along a predetermined axis.

A further schematic exemplary embodiment is shown in FIG. 5. The dedicated coil S' shown here comprises 14 equally large coil elements S3, S3', of which four are arranged inside the oral cavity (S3') and ten are arranged inside the oral cavity (S3), between lips and teeth around the row Z of teeth.

The coil elements S3 of the coil S' that are arranged externally around the row Z of teeth are arranged along an outer curve B1 following the row Z of teeth. For example, for this the coil elements S3 are mounted on a first support construction following the curve B1, which first support construction can be inserted into the mouth.

The coil elements S3' of the coil S' that are arranged inside the row Z of teeth are arranged along an inner curve B2 that likewise follows the row Z of teeth. For example, for this the coil elements S3 are mounted on a second support construction following the curve B2, which second support construction can be inserted into the mouth.

The first and second support construction can in particular also be executed as a single support construction which can be placed in the mouth—for example in the manner of a dental retainer—such that the coil elements S3, S3' are located opposite the row Z of teeth.

The individual coil elements S1, S2, S2', S3, S3' of a coil S, S' that is dedicated to dental imaging can in particular be associated with different channels of a multichannel-capable magnetic resonance system. Individual channels therefore can be controlled separately, and measurement can be acquired simultaneously (in different channels) and be reconstructed into projection image data. For example, individual teeth of a row Z of teeth can thus be acquired simultaneously in a measurement across different coil elements S1, S2, S2', S3, S3' (and therefore different channels) and be reconstructed. The entire measurement time period is therefore further accelerated. In modern magnetic resonance systems, a large number of channels are typically already available for different radio-frequency coils, which channels respectively include the dedicated coils.

Although modifications and changes may be suggested by those skilled in the art, it is the intention of the inventor to embody within the patent warranted hereon all changes and modifications as reasonably and properly come within the scope of his contribution to the art.

We claim:

1. A method to acquire magnetic resonance data from at least one tooth of an examination subject comprising:

operating a magnetic resonance data acquisition unit with a data acquisition sequence to acquire magnetic resonance data from at least one tooth of an examination subject;

using, as said pulse sequence, a pulse sequence having an echo time of less than 0.5 milliseconds and that spatially codes the acquired measurement data from said at least one tooth in only two spatial directions;

providing the acquired magnetic resonance data to a processor and, in said processor, generating projection image data representing a two-dimensional projection of said at least one tooth from said magnetic resonance data that are spatially coded in only two spatial directions; and making said projection image data available in electronic form at an output of said processor, as a data file.

2. A method as claimed in claim 1 comprising operating said magnetic resonance data acquisition unit by activating phase coding gradients in said pulse sequence that cause a projection direction of said projection image data to proceed along a predetermined axis.

3. A method as claimed in claim 1 comprising operating said magnetic resonance data acquisition unit with said pulse sequence to enter said measurement data into k-space corresponding to an imaging region that comprises said at least one tooth, by entering said magnetic resonance data into a first region of k-space along radial trajectories and entering magnetic resonance data into a second region of k-space, that is not covered by said first region and that includes a center of k-space, at least twice, point-by-point, according to a single point imaging sequence.

4. A method as claimed in claim 3 comprising entering said magnetic resonance data into a portion of k-space that is not covered by said first region and that includes said k-space center, along a Cartesian trajectory.

5. A method as claimed in claim 1 comprising operating said magnetic resonance data acquisition unit with said pulse sequence to radiate radiofrequency pulses into said examination subject with a coil having a shape and dimensions dedicated to dental imaging, and having an exposure volume comprising at least two molars or up to four incisors of said examination subject.

6. A method as claimed in claim 1 comprising operating said magnetic resonance data acquisition unit in said pulse sequence to acquire said magnetic resonance data with a coil dedicated to dental imaging having an acquisition volume comprising at least two molars or up to four incisors of said examination subject.

7. A magnetic resonance coil dedicated to dental imaging comprising a plurality of coil elements each comprising a coil conductor; and each coil conductor being configured with a shape and dimensions that allow said coil elements to fit in gaps around and within a row of teeth of an examination subject, so as to cause each coil conductor to radiate or receive radiofrequency signals only within a volume of a size encompassing at least two molars or up to four incisors of said row of teeth.

8. A coil as claimed in claim 7 wherein each coil element is configured to respectively radiate or detect signals in respective volumes of equal size, or different sizes.

9. A coil as claimed in claim 7 wherein said coil elements are shaped and dimensioned to follow a curve of said row of teeth of the examination subject.

10. A magnetic resonance apparatus comprising:

a magnetic resonance data acquisition unit;

a control unit configured to operate the magnetic resonance data acquisition unit with a data acquisition sequence to acquire magnetic resonance data from at least one tooth of an examination subject;

said control unit being configured to use, as said pulse sequence, a pulse sequence having an echo time of less than 0.5 milliseconds and that spatially codes the acquired measurement data from said at least one tooth in only two spatial directions;

a processor provided with the acquired magnetic resonance data, said processor being configured to generate projection image data representing a two-dimensional projection of said at least one tooth from said magnetic resonance data that are spatially coded in only two spatial directions; and said processor being configured to make said projection image data available in electronic form at an output of said processor, as a data file.

11. A non-transitory, computer-readable data storage medium encoded with programming instructions, said data storage medium being loaded into a computerized control and evaluation system of a magnetic resonance apparatus, that also comprises a magnetic resonance data acquisition unit, said programming instructions causing said control and evaluation unit to:

operate the magnetic resonance data acquisition unit with a data acquisition sequence to acquire magnetic resonance data from at least one tooth of an examination subject;

use, as said pulse sequence, a pulse sequence having an echo time of less than 0.5 milliseconds and that spatially codes the acquired measurement data from said at least one tooth in only two spatial directions;

generate projection image data representing a two-dimensional projection of said at least one tooth from said magnetic resonance data that are spatially coded in only two spatial directions; and make said projection image data available in electronic form at an output of said control and evaluation unit, as a data file.

* * * * *